United States Patent
Itabashi et al.

(10) Patent No.: US 11,243,462 B2
(45) Date of Patent: Feb. 8, 2022

(54) LITHOGRAPHY APPARATUS, METHOD OF FORMING PATTERN, AND METHOD OF MANUFACTURING ARTICLE

(71) Applicant: CANON KABUSHIKI KAISHA, Tokyo (JP)

(72) Inventors: Hiroaki Itabashi, Nasu-gun (JP); Takuji Maruta, Utsunomiya (JP); Ryo Nakamichi, Utsunomiya (JP); Tomonori Tsukahara, Kanuma (JP)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 16/366,987

(22) Filed: Mar. 27, 2019

(65) Prior Publication Data

US 2019/0302606 A1 Oct. 3, 2019

(30) Foreign Application Priority Data

Mar. 30, 2018 (JP) .............................. JP2018-069288

(51) Int. Cl.
*G03F 1/42* (2012.01)
*G03F 7/20* (2006.01)
*H01L 21/027* (2006.01)

(52) U.S. Cl.
CPC .............. *G03F 1/42* (2013.01); *G03F 7/2004* (2013.01); *G03F 7/70141* (2013.01); *H01L 21/0274* (2013.01)

(58) Field of Classification Search
CPC ...... G03F 1/42; G03F 7/70141; G03F 9/7065; G03F 7/7004

USPC .............................. 355/53, 67; 356/399-401
See application file for complete search history.

(56) References Cited

U.S. PATENT DOCUMENTS

| | | | | |
|---|---|---|---|---|
| 5,309,197 A * | 5/1994 | Mori | ...................... | G03F 9/7088 355/53 |
| 6,233,042 B1 * | 5/2001 | Kanda | ................. | G03F 7/70258 355/53 |
| 6,285,455 B1 * | 9/2001 | Shiraishi | .................... | G03F 9/70 356/486 |
| 6,630,746 B1 * | 10/2003 | Mancini | ................ | G03F 9/7069 257/797 |
| 2002/0102477 A1 * | 8/2002 | Tanaka | ...................... | G03F 1/38 430/5 |

(Continued)

FOREIGN PATENT DOCUMENTS

| JP | H05-315215 A | 11/1993 |
|---|---|---|
| JP | 2004-279873 A | 10/2004 |
| JP | 2005-92137 A | 4/2005 |

(Continued)

*Primary Examiner* — Hung Nguyen
(74) *Attorney, Agent, or Firm* — Canon U.S.A., Inc. IP Division (57) ABSTRACT

A lithography apparatus includes a formation unit that forms an alignment mark on a substrate by irradiating the substrate that includes a photosensitizer with light, and a transfer unit that aligns the substrate on the basis of the position of the alignment mark and that transfers a pattern to the substrate by illuminating the photosensitizer with exposure light. The formation unit irradiates a material of a grounding of the photosensitizer with irradiation light at a wavelength that differs from that of the exposure light and forms the alignment mark on the material by processing the material with energy of the irradiation light.

20 Claims, 6 Drawing Sheets

(56) References Cited

U.S. PATENT DOCUMENTS

2012/0032356 A1* 2/2012 Reymann .............. G03F 9/7084
257/797
2019/0212658 A1* 7/2019 Huisman ............... G03F 9/7046

FOREIGN PATENT DOCUMENTS

| | | | |
|---|---|---|---|
| JP | 2005-268747 | A | 9/2005 |
| JP | 2006-017975 | A | 1/2006 |
| JP | 2006-073779 | A | 3/2006 |
| JP | 2008-192920 | A | 8/2008 |
| JP | 2008-233781 | A | 10/2008 |
| JP | 2015-138928 | A | 7/2015 |
| JP | 2017-016069 | A | 1/2017 |
| JP | 2017-130495 | A | 7/2017 |
| JP | 6584567 | B1 | 10/2019 |

\* cited by examiner

LITHOGRAPHY APPARATUS, METHOD OF FORMING PATTERN, AND METHOD OF MANUFACTURING ARTICLE

BACKGROUND OF THE INVENTION

Field of the Invention

The present invention relates to a lithography apparatus, a method of forming a pattern, and a method of manufacturing an article.

Description of the Related Art

A semiconductor and a liquid crystal panel, for example, are manufactured by a photolithography process. In the photolithography process, an exposure device is used and projects a pattern of an original, which is called a mask or a reticle, on a substrate (a glass substrate or a wafer) to which a resist (photosensitizer) is applied by using a projection optical system.

In some exposure processes, exposure devices are used to expose exposure regions having different areas on a single substrate to light. A first region of the substrate is first exposed to light by using a first exposure device, and the substrate is unloaded from the first exposure device. Subsequently, the substrate is loaded on a second exposure device, and a second region in an unexposed region of the substrate is exposed to light by using a second exposure device. When the second region is exposed to the light by using the second exposure device, a relative position of the second region with respect to the first region that has been exposed to the light is preferably ensured.

Japanese Patent Laid-Open No. 2005-92137 discloses that an alignment mark is formed to ensure relative positions of exposure regions that are exposed to light before and after a substrate is unloaded. Specifically, the alignment mark is formed on the substrate in a manner in which a part of a resist on the substrate is irradiated with a laser beam in an exposure device before a first region is exposed to the light to remove the resist. The substrate is aligned with respect to an original on the basis of the position of the formed alignment mark, and the first region and a second region of the substrate are exposed to the light.

However, the invention disclosed in Japanese Patent Laid-Open No. 2005-92137 carries a risk that a failure occurs in a circuit pattern that is formed by exposing the substrate to the light because the resist that is removed to form the alignment mark scatters over the surroundings and becomes a foreign substance.

SUMMARY OF THE INVENTION

A lithography apparatus according to an aspect of the present invention for solving the above problem is a lithography apparatus that forms a pattern on a substrate. The lithography apparatus includes a formation unit that forms an alignment mark on the substrate by irradiating, with light, the substrate that includes a first material and a photosensitizer that is applied to the first material, and a transfer unit that aligns the substrate on the basis of a position of the alignment mark that is formed by the formation unit and that transfers the pattern to the substrate by illuminating the photosensitizer with exposure light. The formation unit irradiates the first material with irradiation light at a wavelength that differs from that of the exposure light and forms the alignment mark on the first material by processing the first material with energy of the irradiation light.

DESCRIPTION OF THE EMBODIMENTS

Preferred embodiments of the present invention will hereinafter be described in detail with reference to the attached drawings.

First Embodiment

According to the present embodiment, an exposure device for manufacturing a flat panel display (FPD) will be described as an example of a lithography apparatus that forms a pattern on a substrate. The exposure device illuminates a mask (an original or a reticle) and exposes a pattern of the mask to light against the substrate (such as a wafer or a glass substrate). The exposure device projects the pattern of the mask on the substrate to which a photosensitizer (resist) is applied by using, for example, a projection optical system to form a latent pattern on the photosensitizer.

Figure 1:
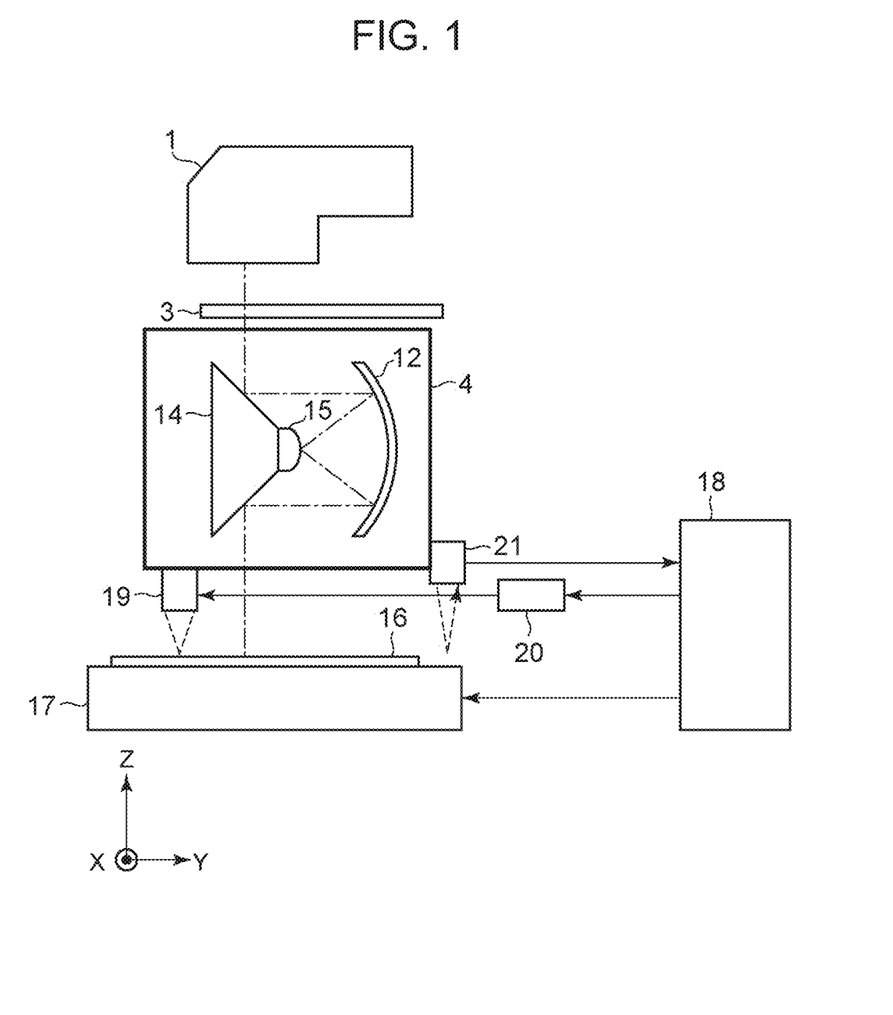
FIG. 1 schematically illustrates an exposure device according to a first embodiment.

FIG. 1 schematically illustrates the exposure device according to a first embodiment. A direction (vertical direction) perpendicular to a surface of a substrate 16 is referred to as the Z-direction, and directions perpendicular to the Z-direction are referred to as X and Y directions. The exposure device according to the present embodiment includes an illumination system 1 and a projection optical system 4 that projects a pattern of an original 3 on the substrate 16. The exposure device also includes an alignment scope that detects alignment marks of the substrate 16 and the original 3. For example, the illumination system 1 includes a light source, a lens, and a mirror. For example, the light source can include a mercury lamp and an ellipse mirror. The illumination system 1 defines an illumination region having a predetermined shape and illuminates a part of the original 3. The projection optical system 4 projects an image of the pattern of the original 3 that is illuminated by the illumination system 1 on the substrate 16. The original 3 is disposed at a position in an object surface of the projection optical system 4. The substrate 16 is disposed at a position in an image surface of the projection optical system 4. The original 3 is held by a stage not illustrated. The projection optical system 4 can be constituted as an imaging optical system of the same magnification, enlargement, or reduction. FIG. 1 illustrates the projection optical system that includes a mirror 14, a concave mirror 12, and a convex mirror 15. The image of the pattern of the original 3 that is illuminated by the illumination system 1 is imaged on the substrate 16 at the same magnification via the mirror 14, the concave mirror 12, and the convex mirror 15 of the projection optical system 4 and via the concave mirror 12 and the mirror 14 again. The projection optical system can also be constituted as a projection lens that mainly uses a lens or a catadioptric optical system and can also be constituted as imaging optical systems. A stage 17 includes a holding mechanism for holding the substrate 16. The substrate 16 is held by the holding mechanism of the stage 17. The stage 17 also includes an adjusting mechanism for adjusting an angle about the Z-axis and the X- and Y-positions of the substrate 16 on the stage 17. The stage 17 is driven on the basis of a drive instruction from a main control unit 18, and the position of the substrate 16 is controlled. The main control unit 18 controls the position of the stage 17 in the X-, Y-, and Z-directions and a rotation angle in these directions on the basis of the position and angle of the stage 17 that are measured by a position sensor such as an interferometer or an encoder. The exposure device aligns the substrate 16 with respect to the original 3 and exposes the pattern of the original 3 to light against the substrate 16 while synchronously moving the original 3 and the substrate 16 in a predetermined direction. At this time, the illumination region of the illumination system 1 moves above the original 3, the entire pattern of the original 3 is illuminated, a projection region of the projection optical system 4 moves above the substrate 16, and the substrate 16 is exposed to light. A region of the substrate 16 that is thus exposed to the light while the original 3 and the substrate 16 are synchronously moved is referred to as an exposure region.

The illumination system 1, the projection optical system 4, the stage 17, and the main control unit 18 function as a transfer unit that transfers the pattern of the mask to the substrate. The main control unit 18 controls not only the stage but also operation of the components of the exposure device, for example, for sequential control. The main control unit 18 also controls a control unit 20 that controls mark-forming units 19.

The exposure device according to the present embodiment includes the mark-forming units 19 (formation units). The control unit 20 controls the mark-forming units 19 on the basis of an instruction from the main control unit 18. The main control unit 18 transmits an irradiation instruction to the control unit 20 after the stage 17 is moved to a predetermined position. The mark-forming units 19 are controlled by the control unit 20, and the substrate 16 is irradiated.

Each mark-forming unit 19 is disposed so as to be secured to a structure that holds the projection optical system 4. The mark-forming unit 19 uses a light source such as a laser to radiate spot-like luminous flux such as a laser beam to the substrate 16 that is held on the stage 17. The mark-forming unit 19 forms an alignment mark for alignment on the substrate 16 by radiating light. The control unit 20 determines irradiation conditions such as the wavelength, intensity, irradiation time, and amount of irradiation light. The control unit 20 controls the mark-forming unit 19 such that the mark-forming unit 19 radiates the light in the determined irradiation conditions. The mark-forming unit 19 may change the irradiation conditions by using an adjustment unit that adjusts the wavelength, intensity (output), and output time of the light that is radiated from the light source. The mark-forming unit 19 can adjust the wavelength, intensity, irradiation time, and amount of the irradiation light by using a wavelength filter, a ND filter, or a shutter (light-shielding plate).

The alignment mark that is formed on the substrate 16 by each mark-forming unit 19 is measured by a measurement unit 21. The measurement unit 21 is disposed so as to be secured to a structure that holds the projection optical system 4. Relative positions of the mark-forming unit 19 and the measurement unit 21 are such that these have a known relationship. The mark-forming unit 19 and the measurement unit 21 may be movable. The measurement unit 21 includes an illumination system that illuminates the alignment mark by using a light source. The measurement unit 21 includes a sensor (imaging unit) that images the alignment mark. In FIG. 1, measurement light from the measurement unit 21 is illustrated in a dotted line. The wavelength of the measurement light is, for example, 500 to 600 nm. The sensor can be an area image sensor that carries out photoelectric conversion of light that is received into an electrical signal. The measurement unit 21 or the control unit 20 includes a storage unit (such as a memory) that obtains and stores an image containing the imaged alignment mark and a calculator (such as a CPU) that calculates the position of the alignment mark by using data of the obtained image. The main control unit 18 obtains data of the position (measurement result) of the alignment mark that is calculated by the calculator, controls rotation in the Z-direction and the position of the stage 17 in the X- and Y-directions on the basis of the measurement result, and causes the substrate 16 to be aligned with respect to the original 3. The main control unit 18 controls, for example, the illumination system 1, the projection optical system 4, and the stage 17 for exposure of the pattern of the original 3 to light against the aligned substrate 16.

FIGS. 2(a) and 2(b) illustrate states where alignment marks M are formed by using the mark-forming units 19. Each mark-forming unit 19 radiates the spot-like luminous flux to the substrate 16 by using the light source such as a laser. In FIGS. 2(a) and 2(b), the irradiation light is illustrated by dotted lines. The substrate 16 includes glass 16a, a metal film 16b (first material) that is deposited on an upper portion of the glass 16a, and a resist (photosensitizer) 16c that is applied to the first material. The substrate 16 is obtained by depositing the metal film 16b on the flat-plate glass 16a and applying the resist on the metal film 16b. The metal film 16b is a material of a grounding of the resist 16c and is used to form a wiring pattern of a semiconductor device such as a transistor, for example, by being processed by a subsequent process such as etching. Examples of the material of the metal film 16b include copper, chromium, and an aluminum alloy. Examples of the material of the resist 16c include a photosensitive material the main component of which is a resin, and examples of the resin include novolac and resole phenolic resins.

In an example illustrated in FIG. 2(a), the mark-forming units 19 irradiate, with light, regions R2 in which the alignment marks are to be formed outside a region R1 (exposure region) to which the pattern of the mask is to be transferred. The mark-forming units 19 radiate the light at a wavelength transmissible through the resist 16c. The wavelength is set such that the absorbance of the resist 16c is lower than the absorbance of the metal film 16b at the wavelength of the irradiation light from the mark-forming units 19. Since the light absorbance of the resist 16c is low, the light from the mark-forming units 19 passes through the resist 16c, and the metal film 16b that forms a boundary surface to the resist 16c is irradiated with the light. Since the absorbance of the metal film 16b is high, the metal film 16b is thermally processed by energy of the irradiation light, and the light from the mark-forming units 19 causes the alignment marks M to be formed on the metal film 16b. The marks that are circular when viewed from the upper surface are formed on the metal film 16b by, for example, spot-like irradiation luminous flux. For example, each alignment mark M is a portion the color of which changes into a black color. When the alignment marks are imaged by the measurement unit 21 via the resist 16c, the light intensity thereof is lower than that of the surroundings in the imaged image. The control unit 20 uses a difference (contrast) in the light intensity to calculate the positions of the alignment marks. In the example illustrated in FIG. 2(a), the resist 16c is not removed, and the alignment marks M are formed on the metal film 16b.

In an example illustrated in FIG. 2(b), the resist 16c is applied to the region R1 of the substrate 16 to which the pattern of the mask is to be transferred, and the resist 16c is not applied to the regions R2 in which the alignment marks are to be formed. The resist 16c can be applied only to the region R1 in a manner in which the regions R2 are covered by masks such that the resist 16c is not applied thereto. The mark-forming units 19 directly irradiate a surface of the metal film 16b in the regions R2 to which the resist 16c is not applied. That is, the mark-forming units 19 irradiate the metal film 16b not via the resist 16c. The metal film 16b is thermally processed by the energy of the irradiation light, and the alignment marks M are formed on the metal film 16b. At this time, the wavelength of the light with which the metal film 16b is irradiated may be a wavelength that differs from the wavelength transmissible through the resist 16c or a wavelength sensitive to the resist 16c. For example, the wavelength may be the same as the wavelength of exposure light to which the region R1, in which the pattern of the mask is to be transferred, is exposed. The glass and the materials of the metal film and the resist may differ from the glass and the materials of the metal film and the resist illustrated in the example in FIG. 2(a). As illustrated in FIG. 2(b), the alignment marks M that are formed on the metal film 16b are imaged by the measurement unit 21 not via the resist 16c.

In the example described above, the metal film is thermally processed to form the alignment marks on the metal film. In the example in FIG. 2(a), however, the resist on a metal surface may be carbonized (changed in quality) by applying a thermal load to the metal film to form the alignment marks on the resist. That is, in some cases, the resist itself includes the alignment marks.

The control unit 20 that determines the irradiation conditions will now be described. The control unit 20 includes an obtaining unit that obtains information about physical properties of an object to be irradiated and determines the wavelength, intensity (output), time of the luminous flux that is radiated on the basis of the obtained information. The wavelength is determined in advance on the basis of information about the absorbance of the resist, the metal film, or both, which are objects to be irradiated, at the wavelength. For example, the wavelength is selected such that the absorbance of the metal film is high (sensitive) and the wavelength is transmissible through the resist. For the exposure device that exposes the resist on the substrate to light by using i-line (a wavelength of 365 nm) as the exposure light, the wavelength is a wavelength other than the wavelength of the i-line (exposure light). For example, for the exposure device that exposes the resist on the substrate to light by using g-line (436 nm), h-line (405 nm), and the i-line as the exposure light, the wavelength is a wavelength other than the wavelength of the g-line, the h-line, and the i-line (exposure light), and the absorbance of the metal film at the wavelength is 20% or more. In the case where there is distribution of the wavelength of the exposure light, the metal film may be irradiated with light at a wavelength that differs at least from a wavelength at a peak position in the distribution of the wavelength of the exposure light. In an example in which the material of the metal film is copper, the wavelength can be 532 nm.

Figure 2:
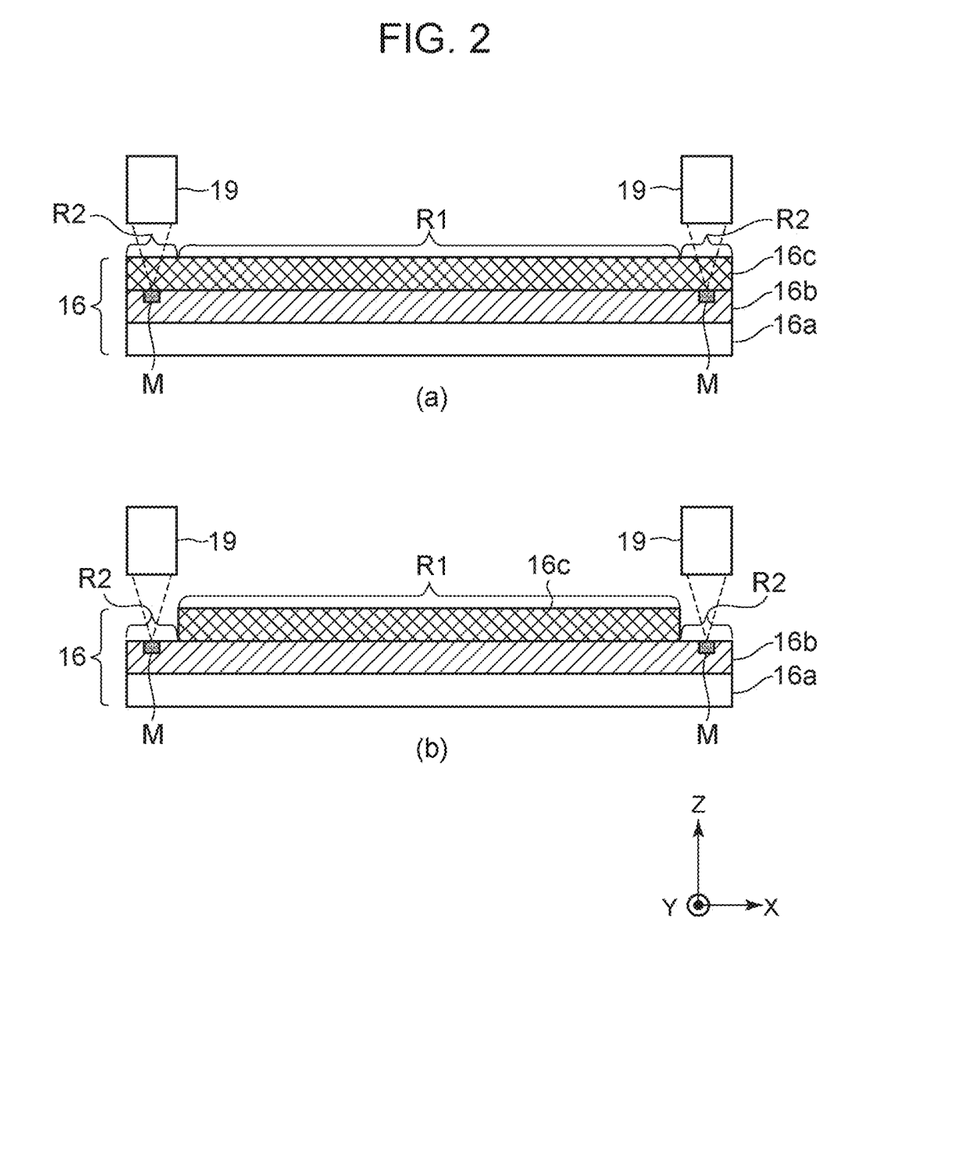
FIG. 2 illustrate formation of marks according to the first embodiment.

The time and intensity (output) of the irradiation light can be determined in advance by performing a test. For example, a test substrate the material of which is the same as the substrate on which a circuit pattern such as a device is actually exposed to the light is irradiated while the values of the time and intensity (output) of the irradiation light are changed by using the mark-forming units 19, marks that are formed are measured, and the determination can be made on the basis of a measurement result. The irradiation conditions can be set on the basis of limiting conditions such as a condition in which the marks can be measured with high repeatability, a condition that barely affects the resist when the metal film is irradiated via the resist, a condition that barely affects the metal film, or a condition that barely affects the glass substrate. In order to reduce damage of the substrate, an irradiation output (intensity) is preferably low, and the irradiation time is preferably short. However, it is necessary for the intensity and the irradiation time to be appropriately set in order to increase the repeatability of the measurement of the alignment marks. These irradiation conditions can be changed depending on the material (physical properties) of the metal film and the resist and the glass of the substrate. In FIG. 2, the focal point of the irradiation light of the mark-forming units 19 is on the surface of the metal film 16b but is not limited thereto. The irradiation conditions can be changed such that the focal point is defocused from the surface of the metal film in a manner in which the position of the focal point of the irradiation light of the mark-forming units 19 is changed in a focus direction.

Figure 3:
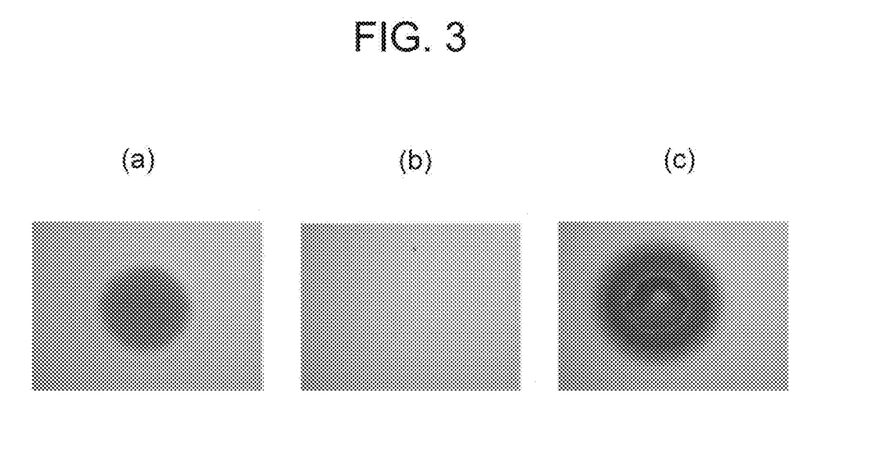
FIG. 3 illustrate examples of the marks.

FIG. 3 illustrate examples of images of the alignment marks M that are formed when the substrate illustrated in FIG. 2(a) is irradiated by using one of the mark-forming units. FIG. 3(a) illustrates the image in the case of irradiation with light from the mark-forming unit. The metal film in an irradiated region changes in quality, the resist is carbonized, and the marks are formed in the irradiate region. FIG. 3(b) illustrates the image in the case of irradiation with light weaker than that in the case of FIG. 3(a). Since the irradiation light is weak, the metal film and the resist do not change. FIG. 3(c) illustrates the image in the case of irradiation with light stronger than that in the case of FIG. 3(a). The intensity of the irradiation light is so strong that a hole is formed in the metal film. The mark in the image can be measured. However, the metal film is damaged.

Figure 4:
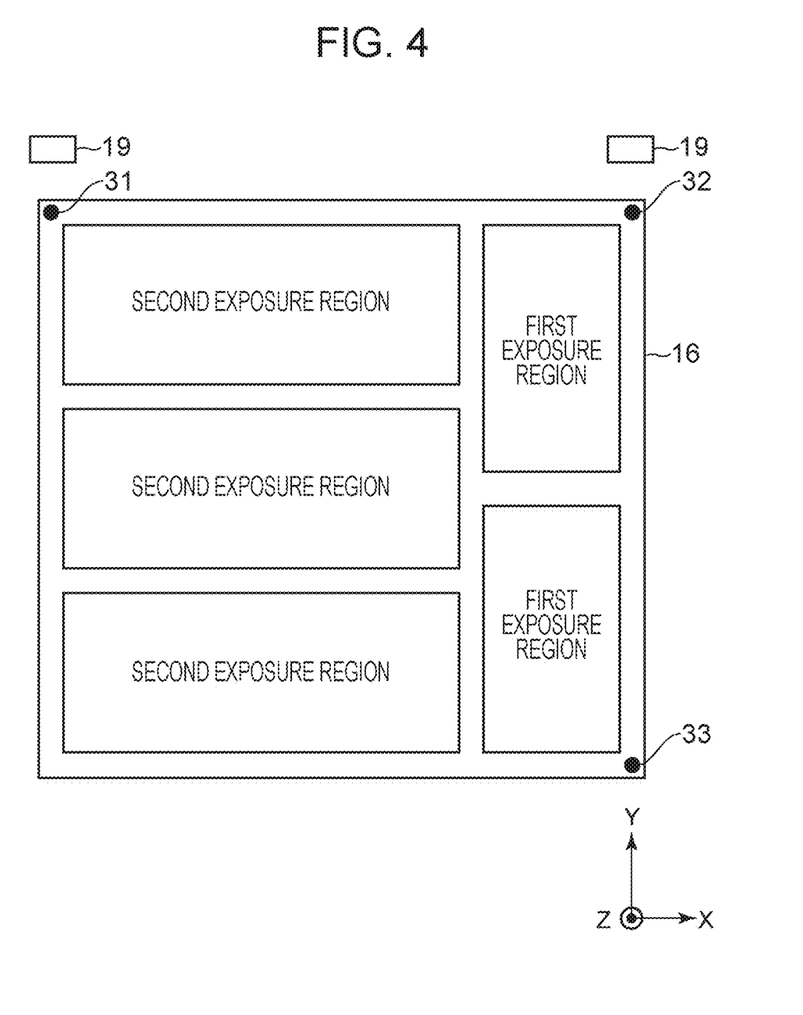
FIG. 4 illustrates a layout of exposure regions of a substrate.

FIG. 4 illustrates a layout of the exposure regions and the alignment marks of the substrate. According to the present embodiment, two mark-forming units 19 are disposed in the exposure device, the mark-forming units 19 form three alignment marks 31, 32, and 33 near corner portions of the substrate 16. The two mark-forming units 19 are arranged so as to be apart from each other in the X-direction perpendicular to the Y-direction in which the substrate is moved when the substrate is exposed to the light. The main control unit 18 first controls the position of the stage 17 to move the stage 17 to a predetermined position and aligns regions in which the alignment marks 31 and 32 are to be formed such that the regions are just below the two mark-forming units 19. After the substrate is aligned, the main control unit 18 instructs the control unit 20 of irradiation timing. The control unit 20 controls the two mark-forming units 19 such that the mark-forming units 19 radiate the light to the substrate, and the alignment marks 31 and 32 are formed on the substrate that is irradiated by the two the mark-forming units 19. Subsequently, the stage 17 is moved in the Y-direction, and one of the mark-forming units 19 forms the alignment mark 33 on the substrate in the same manner. The number of the mark-forming units 19 may be one or three or more so as to be suitable to the layout of the exposure regions. The number of the alignment marks that are formed may be four or more. It is necessary to form three or more alignment marks that are apart from each other in order to measure the rotation angle about the Z-direction and the position of the substrate in the X- and Y-directions.

The measurement unit 21 measures the positions of the alignment marks 31, 32, and 33 in the X- and Y-directions after the alignment marks are formed on the substrate. The exposure device determines the positions of the exposure regions of the substrate that are to be exposed to the light on the basis of the measurement result of the measurement unit 21. According to the present embodiment, the exposure regions are determined on the basis of the common measurement result of the positions of the alignment marks, and a relationship between relative positions of the exposure regions can be ensured.

In an example illustrated in FIG. 4, a layout of two first exposure regions and three second exposure regions on the substrate is defined for exposure to the light. The two first exposure regions have the same area. The three second exposure regions have the same area. The first exposure regions and the second exposure regions have different areas. For this reason, the two first exposure regions are exposed to the light while the substrate is moved in the Y-direction by using a first exposure device that can expose the substrate to the light in the illumination region having a width that fits to the width of the first exposure regions. Subsequently, the three second exposure regions are exposed to the light while the substrate is moved in the X-direction by using a second exposure device that can expose the substrate to the light in the illumination region having a width that fits to the width of the second exposure regions. In the description, the first exposure device and the second exposure device are different devices, that is, the exposure devices are covered by respective chambers (housings). However, a single illumination system and a single projection system may be paired with each other (a single station), and pairs of optical systems may be disposed in the same chamber, and the first exposure regions and the second exposure regions may be exposed to the light by using the pairs of optical systems. The substrate that is unloaded and that is rotated 90 degrees may be loaded again on the same exposure device and may be exposed to the light with the substrate rotated 90 degrees.

The first exposure regions and the second exposure regions that have different areas are thus exposed to the light. This enables articles such as devices or color filters that have different sizes to be manufactured from the exposure regions. In this way, kinds of articles such as devices are manufactured from the single substrate. This achieves efficient manufacture according to various needs of manufacture.

Figure 5:
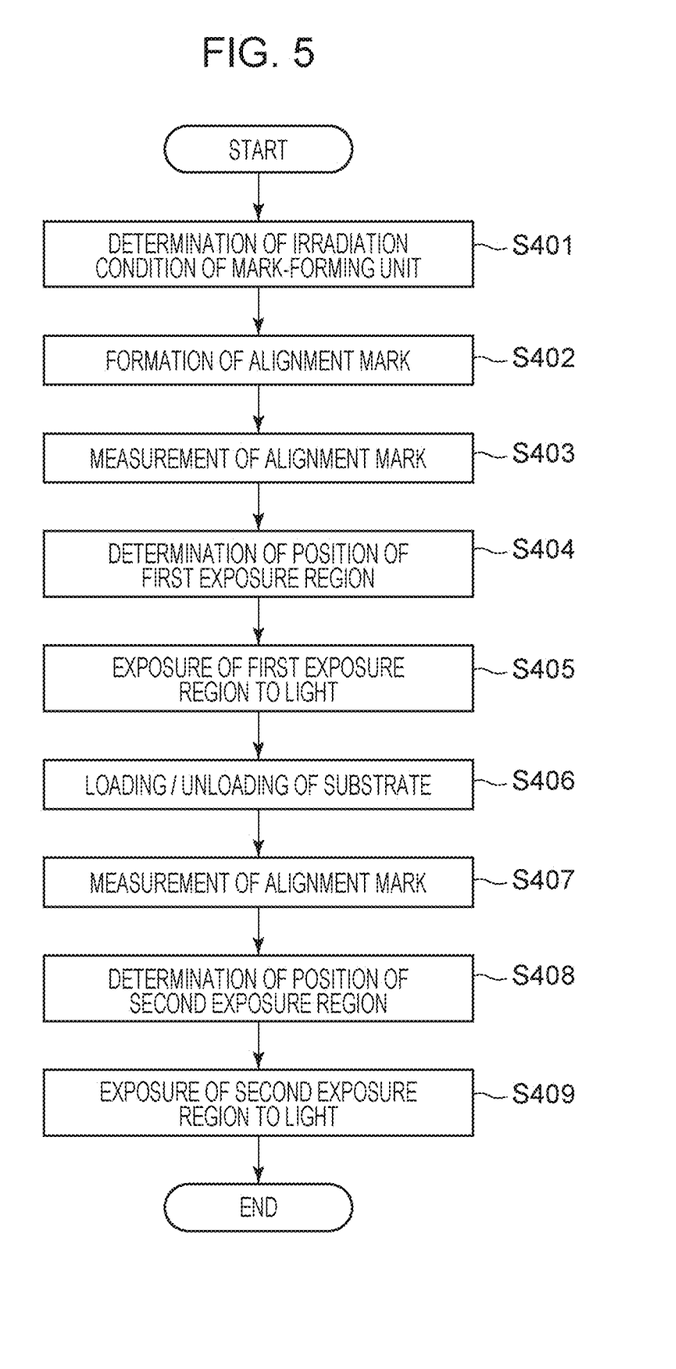
FIG. 5 is a flowchart of a method of forming the marks and an exposure method.

With reference to FIG. 5, an exposure method will now be described as an example of a method of forming a pattern on the substrate. FIG. 5 is a flowchart of the exposure method. The substrate that is to be exposed to the light is loaded on the first exposure device that serves as the above exposure device and held on the stage 17. Above the stage 17 is the adjusting mechanism that adjusts the position and angle of the substrate 16. The position and angle of the substrate that is held on the stage 17 are adjusted by the adjusting mechanism. In the first exposure device, exposure conditions (recipe) are set for the substrate to be exposed to the light.

At a step S401, the irradiation conditions of the mark-forming units 19 are determined. The irradiation conditions that are determined include the wavelength, intensity, time of the irradiation light. The obtaining unit of the control unit 20 obtains information about the physical properties of the metal film, the resist, or both of the substrate, and the wavelength can be determined on the basis of the information. The information about the physical properties may be inputted by a user of the exposure device by using a user interface, or the control unit may obtain the information from a management server. The user may determine the wavelength of the irradiation light on the basis of information about the absorbance at the wavelength in the physical properties of the metal film and the resist that are formed on the substrate to be exposed to the light, and may input the determined wavelength into the control unit of the exposure device. Similarly, the time and intensity of the irradiation light can be determined on the basis of the information about the physical properties of the metal film and the resist of the substrate. However, in the case where the substrate contains a material that has not exposed to the light by the exposure device, before exposure, marks are formed by using a test substrate the material of which is the same as the substrate while irradiation conditions are changed in the above manner, and the irradiation conditions can be determined on the basis of the measurement result of the marks. Once the irradiation conditions are determined, the material of the substrate (the resist and the metal film) and the irradiation conditions may be associated with each other and stored in the memory of the control unit 20 or the main control unit 18. In this case, if another substrate composed of the same material is thereafter exposed to the light, the irradiation conditions that are related to the material can be read from the memory and set. In the case where the materials of the metal film and the resist and the glass of the substrate are changed, the irradiation intensity and the irradiation time may be set on the basis of the values of the physical properties of the materials of the substrate before and after the change. For example, information about the materials of the substrate before the change and about the materials of the substrate after the change may be obtained, a ratio between the absorbances of the materials at an irradiation wavelength may be obtained, and the irradiation intensity and the irradiation time may be calculated on the basis of the ratio, for example, by multiplying the ratio.

At a step S402, the alignment marks are formed on the substrate by using the mark-forming units 19. The position of the stage that holds the substrate is controlled such that the positions in the substrate at which the alignment marks are to be formed are just below the mark-forming units. The mark-forming units 19 are controlled by the control unit 20 in accordance with the irradiation conditions that are determined at the S401, and the mark-forming units 19 irradiate the metal film to form the alignment marks on the metal film. The position of the irradiation light and the irradiation timing are controlled on the basis of an instruction from the main control unit 18.

At a step S403, the positions of the alignment marks that are formed at the S402 are measured by using the measurement unit 21. The stage that holds the substrate on which the alignment marks are formed is moved such that the alignment marks are within a visual field of measurement of the measurement unit 21. Since relative positions of the measurement unit 21 and the mark-forming units 19 are fixed in advance as described above, movement of the substrate by the relative positions of the measurement unit 21 and the mark-forming units 19 enables the alignment marks to be located within the visual field of measurement of the measurement unit 21. The measurement unit 21 measures the alignment marks within the visual field of measurement. Since the measurement unit 21 and the mark-forming units 19 are disposed in the same exposure device, the measurement unit 21 can quickly detect the presence or absence of an abnormality of the alignment marks that are formed by the mark-forming units 19.

At a step S404, the control unit determines the positions of the first exposure regions of the substrate that are to be exposed to the light on the basis of the measurement result of the positions of the alignment marks. At a step S405, the main control unit 18 controls the stage 17 on the basis of information about the positions of the first exposure regions that are determined at the S404, the substrate is aligned, and the first exposure regions are exposed to the light by using the mask, the illumination system, and the projection system.

At a step S406, the substrate the first exposure regions of which are exposed to the light is unloaded from the first exposure device in order to define the other exposure regions in a margin of the substrate. The unloaded substrate is loaded on the second exposure device that exposes the second exposure regions to the light. In an example described according to the exposure method, the substrate is exposed to the light by using the two exposure devices.

At a step S407, the alignment marks that are formed on the substrate that is loaded on the second exposure device are measured by the measurement unit of the second exposure device for the alignment marks. The measurement unit of the second exposure device for the alignment marks has the same structure as the measurement unit 21 of the first exposure device. Since the alignment marks have been already formed on the substrate, the process of forming the alignment marks on the substrate is not again performed. For this reason, the second exposure device may not include the mark-forming units of the first exposure device.

At a step S408, the control unit of the second exposure device determines the positions of the second exposure regions of the substrate that are to be exposed to the light on the basis of the measurement result of the positions of the alignment marks that are measured by the measurement unit of the second exposure device for the alignment marks. At a step S409, the control unit controls the substrate stage of the second exposure device on the basis of information about the positions of the second exposure regions that are determined at the S408 to align the substrate, and the second exposure regions are exposed to the light by using the mask, the illumination system, and the projection system of the second exposure device.

Since the relative positions of the first exposure region and the second exposure region are determined on the basis of the same alignment marks that are formed on the substrate, relative misalignment of the exposure regions can be reduced. The above description of the exposure method includes how to ensure the relative positions of the two exposure regions. However, also in the case where the number of the exposure regions is three or more, the relative positions of the exposure regions can be ensured by repeating S406 to S409. For example, in the case where the exposure regions of three kinds of sizes are exposed to the light, a third exposure region is exposed to the light by using a third exposure device.

The photosensitizer of the substrate is not removed, and the alignment marks are formed on the material that differs from the photosensitizer by using the mark-forming units 19 as described above. This decreases the occurrence of a foreign substance such as an unnecessary resist. The pattern is formed on the substrate in a state where the occurrence of the foreign substance is decreased. This enables a failure of the pattern such as a device that is formed on the substrate to be decreased.

Second Embodiment

Figure 6:
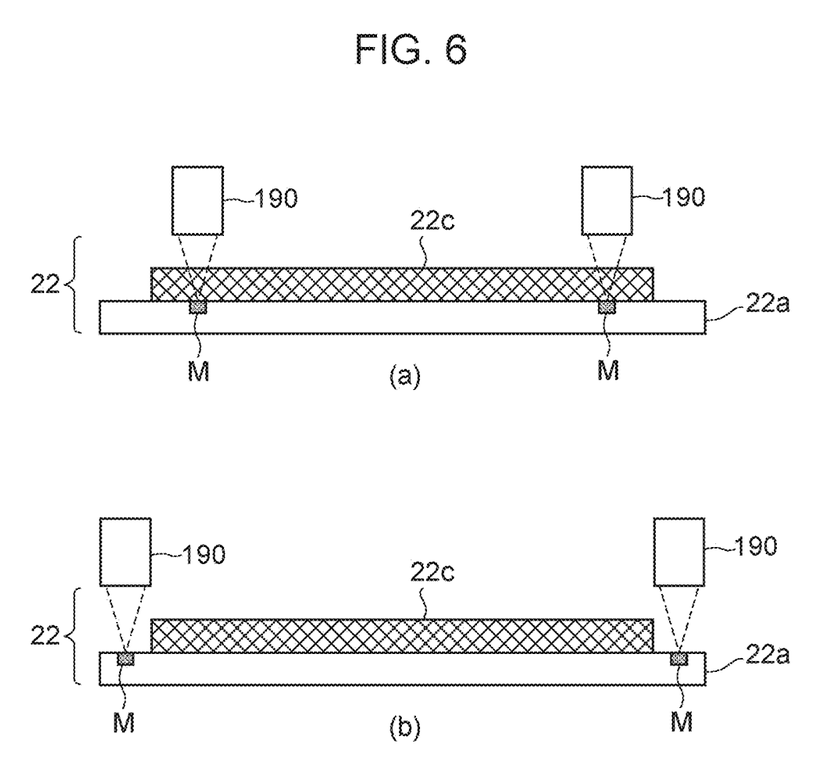
FIG. 6 illustrate formation of the marks according to a second embodiment.

Formation of the alignment marks M according to a second embodiment will now be described with reference to FIG. 6. FIG. 6 illustrate mark-forming units 190 according to the second embodiment and a substrate 22. A description of the same structure and method as in the first embodiment is omitted. The mark-forming units 190 according to the present embodiment are disposed at the same positions as in the first embodiment.

The substrate 22 includes glass 22*a* (first material) and a resist (photosensitizer) 22*c* that is applied to an upper portion of the glass 22*a*. The resist 22*c* is a material to form the pattern of the resist on the glass 22*a* by being exposed to the light by the exposure device and developed by a developing device. According to the present embodiment, the mark-forming units 190 irradiate the glass 22*a* that corresponds to the boundary surface to the resist 22*c* with the light to form the alignment marks M on the glass 22*a*. In FIG. 6(*a*), a surface of the glass 22*a* is irradiated with luminous flux that has passed through the resist 22*c*, via the resist 22*c*, to thermally process the glass 22*a*.

In FIG. 6(*b*), the resist 22*c* is applied to the region of the substrate to which the pattern of the mask is to be transferred, and the resist 22*c* is not applied to the region in which the alignment marks are to be formed. The mark-forming units 190 may directly irradiate the surface of the glass 22*a* with the light in the region to which the resist 22*c* is not applied. That is, the mark-forming units 190 irradiate the surface of the glass 22*a* not via the resist 22*c* to form the alignment marks M on the glass 22*a*.

In an example in FIG. 6(*b*), before the substrate is loaded on the exposure device, the resist 22*c* is not applied to the region of the substrate in which the alignment marks are to be formed but the resist 22*c* is applied to the region of the substrate to which the pattern is to be transferred. The substrate is loaded on the first exposure device and held on the stage. In the first exposure device, the exposure conditions (recipe) for the substrate that is to be exposed to the light are set. Subsequently, the irradiation conditions of the mark-forming units 19 are determined as in the exposure method according to the first embodiment, and the alignment marks M are formed on the substrate.

The wavelength of the light that the mark-forming units 190 radiate is determined such that the absorbance of the glass 22*a* at the wavelength is high, and the wavelength is transmissible through the resist 22*c*. For example, the wavelength is set such that the absorbance of the resist 22*c* is lower than the absorbance of the glass 22*a* at the wavelength of the light from the mark-forming units 190. For example, the wavelength is preferably 10600 nm, which is the wavelength of a $CO_2$ laser. The irradiation time and intensity of the irradiation light of the mark-forming units 190 may be determined on the basis of a result of measurement after marks are formed by using a test substrate as in the first embodiment. The exposure device can obtain information about the physical properties of the substrate and the resist of the substrate and can make determination on the basis of the information.

According to the present embodiment, even when the substrate includes no metal film, the resist that is applied to the substrate is not removed, and the alignment marks can be formed on the substrate by using the mark-forming units 19. This decreases the occurrence of a foreign substance such as an unnecessary resist in the exposure device and enables a failure of the pattern such as a device that is formed on the substrate to be decreased.

<Method of Manufacturing Article>

A method of manufacturing an article will be described. Examples of the article include a semiconductor device, a display device, a color filter, an optical component, and a MEMS. For example, the semiconductor device is manufactured through a previous process of forming a circuit pattern of the substrate and a subsequent process of completing, as a product, a circuit chip that is manufactured in the previous process. The previous process includes a process of exposing, to light, the substrate to which the photosensitizer is applied by using the above exposure device and a process of developing the photosensitizer. The pattern of the photosensitizer that is developed is used as a mask for an etching process, an ion-implantation process, or another process, and the circuit pattern is formed on a wafer. The exposing, developing, and etching processes and another process are repeated to form the circuit pattern that has layers on the substrate. In the subsequent process, dicing is performed on the substrate on which the circuit pattern is formed, and an inspection process, bonding, and mounting of the chip are performed. The display device is manufactured through a process of forming a transparent electrode. The process of forming the transparent electrode includes a process of applying the photosensitizer to a glass substrate on which a transparent conductive film is deposited, a process of exposing, to light, the glass substrate to which the photosensitizer is applied by using the above exposure device, and a process of developing the photosensitizer that is exposed to the light. The manufacturing method according to the present embodiment enables the article to be manufactured with higher quality than that of an existing one.

The preferred embodiments of the present invention are described above. The present invention, however, is not limited to the embodiments, and various modifications and alterations can be made within the range of the spirit thereof.

In the examples described according to the above embodiments, the lithography apparatus is the exposure device. However, the lithography apparatus is not limited thereto and can be an imprint apparatus that forms a pattern on a substrate by using a mold, or an electron beam exposure device that draws a pattern on a substrate by using an electron beam. The lithography apparatus can be a near-field exposure device that causes a mask and a substrate to approach each other for exposure to light without the projection optical system.

In a method of manufacturing an article by using the imprint apparatus, the pattern is formed on a mold material in a manner in which the pattern of the mold is pressed against the mold material such as an uncured resin on the substrate. The formed pattern is used as a mask for, for example, an etching process, and consequently, a circuit pattern can be formed on the substrate.

The alignment marks can be formed on the substrate in a manner in which the above mark-forming units 19 are disposed outside the chamber (housing) of the lithography apparatus, and the same method as the above method of forming the alignment marks is performed above the stage outside the lithography apparatus. The pattern can be formed on the substrate by the lithography apparatus after the substrate on which the alignment marks are formed is loaded on the lithography apparatus.

The present invention is described on the basis of the above embodiments. The present invention, however, is not limited to the above embodiments. The scope of claims below can be interpreted most widely to cover all modifications and equivalent structures and functions.

This application claims the benefit of Japanese Patent Application No. 2018-069288 filed Mar. 30, 2018, which is hereby incorporated by reference herein in its entirety.

What is claimed is:

1. A lithography apparatus that forms a latent pattern on a substrate including a first material and a photosensitizer arranged on a base, the lithography apparatus comprising:
    a formation unit that forms an alignment mark on the substrate; and
    a transfer unit that transfers the latent pattern to the substrate by illuminating the photosensitizer with exposure light,
    wherein the formation unit irradiates the first material with irradiation light at a wavelength different from a wavelength of the exposure light via the photo sensitizer, and forms the alignment mark on the photosensitizer by processing the photosensitizer with heat of the first material generated by energy of the irradiation light.

2. The lithography apparatus according to claim 1, wherein the first material is a metal film.

3. The lithography apparatus according to claim 1, wherein
    the base is glass.

4. The lithography apparatus according to claim 1, wherein the formation unit forms the alignment mark on the first material by irradiating the first material with the light not via the photosensitizer.

5. The lithography apparatus according to claim 1, wherein the alignment mark is a mark formed by changing the color of the photosensitizer with heat that is generated when the formation unit irradiates the first material.

6. The lithography apparatus according to claim 1, further comprising: a control unit that obtains information about the photosensitizer, information about the first material on which the mark is formed, or both and that sets intensity, irradiation time, or both of the irradiation light of the formation unit on the basis of the obtained information.

7. The lithography apparatus according to claim 1, wherein the formation unit forms a plurality of marks on the first material by irradiating the first material of the substrate while changing intensity, irradiation time, or both of the irradiation light, and
    wherein the lithography apparatus includes a control unit that determines the intensity, the irradiation time, or both of the irradiation light of the formation unit on the basis of a result of measurement of the plurality of marks that are formed.

8. A method of forming a latent pattern on a substrate including a first material and a photosensitizer arranged on a base, the method comprising:
    a formation step of forming an alignment mark on the substrate; and
    a step of transferring the latent pattern to the substrate by illuminating the photosensitizer with exposure light,
    wherein, at the formation step, the first material is irradiated with irradiation light at a wavelength different from a wavelength of the exposure light via the photosensitizer, and the alignment mark is formed on the photosensitizer by processing the photosensitizer with heat of the first material generated by energy of the irradiation light.

9. A method of forming an alignment mark on a substrate including a first material and a photosensitizer arranged on a base, the method comprising:
   a formation step of forming the alignment mark on the substrate,
   wherein, at the formation step, the first material is irradiated with irradiation light at a wavelength different from a wavelength of the exposure light via the photosensitizer, and the alignment mark is formed on the photosensitizer by processing the photosensitizer with heat of the first material generated by energy of the irradiation light.

10. A method of manufacturing an article, the method comprising:
   a step of forming a latent pattern on a substrate by using the method according to claim 8; and
   a step of manufacturing the article by processing the substrate on which the pattern is formed.

11. The lithography apparatus according to claim 1, wherein the wavelength of the irradiation light is a wavelength at which the irradiation light passes through the photosensitizer.

12. The lithography apparatus according to claim 1, wherein the alignment mark is a mark for determining a relative positional relation between a first exposure region to be exposed by the lithography apparatus and a second exposure region to be exposed by another lithography apparatus than the lithography apparatus.

13. A lithography apparatus that forms a latent pattern on a substrate including a first material and a photosensitizer arranged on a base, the lithography apparatus comprising:
   a formation unit that forms an alignment mark on the substrate; and
   a transfer unit that transfers the latent pattern to the substrate by illuminating the photosensitizer with exposure light,
   wherein the formation unit irradiates the first material with irradiation light at a wavelength different from a wavelength of the exposure light via the photosensitizer, and forms the alignment mark on the first material by processing the first material.

14. The lithography apparatus according to claim 13, wherein the alignment mark is a mark for determining a relative positional relation between a first exposure region to be exposed by the lithography apparatus and a second exposure region to be exposed by another lithography apparatus than the lithography apparatus.

15. The lithography apparatus according to claim 13, further comprising a control unit that obtains information about the photosensitizer, information about the first material on which the mark is formed, or both and that sets intensity, irradiation time, or both of the irradiation light of the formation unit on the basis of the obtained information.

16. A method of forming a latent pattern on a substrate including a first material and a photosensitizer arranged on a base, the method comprising:
   a formation step of forming an alignment mark on the substrate; and
   a step of transferring the latent pattern to the substrate by illuminating the photosensitizer with exposure light,
   wherein, at the formation step, the first material is irradiated with irradiation light at a wavelength different from a wavelength of the exposure light via the photosensitizer, and the alignment mark is formed on the first material by processing the first material.

17. A method of forming an alignment mark on a substrate including a first material and a photosensitizer arranged on a base, the method comprising:
   a formation step of forming the alignment mark on the substrate,
   wherein, at the formation step, the first material is irradiated with irradiation light at a wavelength different from a wavelength of the exposure light via the photosensitizer, and the alignment mark is formed on the first material by processing the first material.

18. A method of manufacturing an article, the method comprising:
   a step of forming a latent pattern on a substrate by using the method according to claim 16; and
   a step of manufacturing the article by processing the substrate on which the pattern is formed.

19. A method of manufacturing an article by forming, using first and second lithography apparatuses, latent patterns on a substrate including a first material and a photosensitizer arranged on a base, the method comprising:
   a mark formation step of forming an alignment mark on the substrate using the first lithography apparatus;
   a first measurement step of measuring the alignment mark using the first lithography apparatus;
   a first pattern forming step of forming a pattern by transferring a first latent pattern to the substrate by illuminating the photosensitizer with exposure light using the first lithography apparatus;
   a step of transferring the substrate from the first lithography apparatus to the second lithography apparatus;
   a second measurement step of measuring the alignment mark using the second lithography apparatus;
   a second pattern forming step of forming a pattern by transferring a second latent pattern to the substrate by illuminating the photosensitizer with exposure light using the second lithography apparatus, based on the position of the alignment mark measured in the second measurement step; and
   a development step of developing the substrate on which the first latent pattern and the second latent pattern are formed,
   wherein in the mark formation step, the first material is irradiated with irradiation light at a wavelength different from a wavelength of the exposure light via the photosensitizer, and forms the alignment mark on the photosensitizer by processing the photosensitizer with heat of the first material generated by energy of the irradiation light, and
   wherein the article is manufactured from the substrate developed in the development step.

20. A method of manufacturing an article by forming, using first and second lithography apparatuses, latent patterns on a substrate including a first material and a photosensitizer arranged on a base, the method comprising:
   a mark formation step of forming an alignment mark on the substrate using the first lithography apparatus;
   a first measurement step of measuring the alignment mark using the first lithography apparatus;
   a first pattern forming step of forming a pattern by transferring a first latent pattern to the substrate by illuminating the photosensitizer with exposure light using the first lithography apparatus;
   a step of transferring the substrate from the first lithography apparatus to the second lithography apparatus;
   a second measurement step of measuring the alignment mark using the second lithography apparatus;

a second pattern forming step of forming a pattern by transferring a second latent pattern to the substrate by illuminating the photosensitizer with exposure light using the second lithography apparatus, based on the position of the alignment mark measured in the second measurement step; and a development step of developing the substrate on which the first latent pattern and the second latent pattern are formed, wherein in the mark formation step, the first material is irradiated with irradiation light at a wavelength different from a wavelength of the exposure light via the photosensitizer, and forms the alignment mark on the first material by processing the first material, and wherein the article is manufactured from the substrate developed in the development step.

* * * * *